(12) United States Patent
Deleonibus

(10) Patent No.: US 7,666,733 B2
(45) Date of Patent: Feb. 23, 2010

(54) METHOD FOR MAKING A VERTICAL MOS TRANSISTOR WITH EMBEDDED GATE

(75) Inventor: Simon Deleonibus, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 105 days.

(21) Appl. No.: 11/987,725

(22) Filed: Dec. 4, 2007

(65) Prior Publication Data

US 2008/0096354 A1 Apr. 24, 2008

Related U.S. Application Data

(63) Continuation of application No. 10/311,216, filed on Dec. 16, 2002, now abandoned, which is a continuation of application No. PCT/FR01/01950, filed on Jun. 21, 2001.

(30) Foreign Application Priority Data

Jun. 22, 2000 (FR) .................................. 00 08016

(51) Int. Cl.
*H01L 21/8238* (2006.01)
*H01L 21/336* (2006.01)

(52) U.S. Cl. ..................... 438/212; 438/259; 438/271; 257/E21.41; 257/E21.409; 257/E21.412

(58) Field of Classification Search ......... 257/329–331, 257/368, 24, 25, 27, E21.41, E21.409, E21.412, 257/E29.262; 438/212, 259, 271, 272, 587, 438/588, 268, 269, 283, 589
See application file for complete search history.

(56) References Cited

U.S. PATENT DOCUMENTS

| 5,136,350 | A | | 8/1992 | Itoh |
| 5,504,359 | A | | 4/1996 | Rodder |
| 5,739,057 | A | | 4/1998 | Wind et al. |
| 6,107,660 | A | * | 8/2000 | Yang et al. ................... 257/329 |
| 6,518,622 | B1 | * | 2/2003 | Chew et al. ................. 257/329 |
| 6,624,032 | B2 | * | 9/2003 | Alavi et al. ................. 438/283 |

FOREIGN PATENT DOCUMENTS

| DE | 197 46 901 | 5/1999 |
| GB | 2 103 879 | 2/1983 |
| WO | 97 48135 | 12/1997 |

* cited by examiner

*Primary Examiner*—Shouxiang Hu
(74) *Attorney, Agent, or Firm*—Oblon, Spivak, McClelland, Maier & Neustadt, L.L.P.

(57) ABSTRACT

According to the invention, a transistor of vertical MOS type is produced in which an insulating assembly (28) formed above the drain (26) comprises insulating zones (42, 44) either side of the drain; cavities extend under the insulating assembly, either side of the channel (69); the gate (77a, 77b) is formed either side of this insulating assembly; and portions of the gate are located inside the cavities. The invention applies to microelectronics.

10 Claims, 7 Drawing Sheets

METHOD FOR MAKING A VERTICAL MOS TRANSISTOR WITH EMBEDDED GATE

This application is a Continuation Application of Ser. No. 10/311,216 filed Dec. 16, 2002, which is a National Stage of PCT/FR01/01950 filed Jun. 21, 2001 and in turn claims priority to French Application no. 00/08016 filed Jun. 22, 2000.

TECHNICAL FIELD

The present invention concerns a vertical MOS (Metal-Oxide-Semiconductor) transistor and a process for its manufacture.

It finds applications in microelectronics for the manufacture of various devices such as digital reversers for example which use MOS transistors that are complementary to one another.

STATE OF PRIOR ART

A large number of lateral MOS transistors are already known (also called "flat MOS transistors").

In particular, a quantum well lateral MOS transistor, having a structure of pseudo-SOI type, is known through the following document to which reference will be made:

International application PCT/FR97/01075 of 13 Jun. 1997, "Quantum well MOS transistor and processes for fabricating this transistor" international publication number WO97/48135, invention by Simon Deleonibus, corresponding to American patent application filed on 12 Feb. 1998 whose serial number is Ser. No. 09/011,626.

FIG. 1 is a schematic cross section view of a known vertical MOS transistor.

This vertical MOS transistor is formed on a semiconductor substrate 2 and comprises a source 4 in semiconductor material formed on substrate 2, a semiconductor drain 6 arranged above the source 4 which are both identically doped, and a semiconductor channel 8 between the source and the drain of opposite doped type to the source.

The transistor in FIG. 1 also comprises an electrically conductive gate made up of two zones 10 and 12 which surround the assembly formed by the drain 6 and the channel 8.

This transistor also comprises a gate insulator made up of two thin electrically insulating layers 14 and 16 respectively separating the gate zones 10 and 12 from drain 6 and from channel 8 and which, substantially at a right angle, extend along the surface of source 4 thereby insulating the latter from the gate zones 10 and 12.

The vertical MOS transistor in FIG. 1 has a drawback.

The stray capacitance between the gate and the source of this transistor is too high. This results from the fact that this capacitance is inversely proportional to the thickness T of the gate insulator. Yet, between the gate and the channel of the transistor, an insulator of narrow thickness is required since it is desired that a high electric current may circulate in this channel, and it can be shown that this current is a decreasing function of thickness T.

It is also to be noted that the capacitance between the gate and the drain of the transistor in FIG. 1 is minimized by the presence of the gate insulator (made up of two layers 14 and 16).

This known vertical MOS transistor has another disadvantage: the distance between the gate and the drain of the transistor in FIG. 1 cannot be made less than a minimum distance as fixed by the alignment tolerance of the insulating machines used to produce vertical transistors of this type.

DESCRIPTION OF THE INVENTION

The subject of the present invention is a vertical MOS transistor and a process for fabricating this transistor which are able to overcome the preceding disadvantages.

More precisely, the subject of the present invention is firstly a transistor of vertical MOS type comprising:
  a semiconductor substrate
  a source in semiconductor material, formed in or on this substrate;
  a channel formed above the source and made in a semiconductor material with opposite doping to the source,
  a drain formed above the channel and made in a semiconductor material with identical doping to the source, and
  a gate formed either side of the channel and drain and electrically insulated from the source, the channel and the drain,
  this transistor being characterized in that it also comprises:
  an electrically insulating assembly formed above the drain, this electrically insulating assembly comprising, either side of the drain, electrically insulating zones called "spacers", and
  cavities which extend under the electrically insulating assembly, either side of the channel, the gate being formed either side of this electrically insulating assembly, portions of the gate being located inside the cavities.

Thin, electrically insulating, layers extend at least between the channel and these portions of the gate, and other thick electrically insulating layers extend between the gate and the source.

On account of the portions of gate located inside these cavities it can be considered that this transistor of vertical MOS type has an embedded gate.

According to one preferred embodiment of the transistor that is the subject of the invention, the gate is made in a metallic material.

According to one particular embodiment of this transistor, the source, the channel and the drain are made in silicon.

In this case, according to one particular embodiment of the invention, the electrically insulating layers which extend at least between the channel and the portions of gate are made in a material chosen from among silica, silicon nitride and hafnium oxide, more simply denoted HiK (materials with high dielectric constants).

The present invention also concerns a process for fabricating a transistor of vertical MOS type that is the subject of the invention, in which:
  a structure is formed comprising a semiconductor substrate, a source zone, a channel zone and the drain above the channel zone,
  an electrically insulating assembly is formed above the drain and comprises the electrically insulating zones called "spacers" either side of the drain,
  two recesses are formed in the structure either side of the electrically insulating assembly, the respective sidewalls of these recesses the closest to the electrically insulating assembly being positioned under the latter, either side of the channel zone, to form the cavities,
  the electrically insulating layers are formed at least on these sidewalls of the recesses, and other electrically insulating layers at the bottom of these recesses, and
  the transistor gate is formed either side of the electrically insulating assembly reaching into the cavities.

According to a particular embodiment of the process that is the subject of the invention, to form the electrically insulating assembly:

- a first electrically insulating layer is formed on the structure, and on this first layer a second layer which is also electrically insulating,
- these first and second layers are etched to obtain an insulating element called a "chimney" which covers the drain,
- above this insulating element a third layer is formed which is also electrically insulating, and
- this third layer is etched to form the spacers and complete the formation of the electrically insulating assembly.

Preferably, the second layer is able to act as a stop layer for the planar process (planarization stop layer) for a layer of metal which is subsequently formed and which is intended to form the gate of the transistor.

In this case, this second layer is in silicon nitride for example or silicon carbide.

Preferably, in this case, the first layer is also able to act as a buffer layer.

According to one particular embodiment of the process of the invention:

- through the electrically insulating layer a hole is formed which extends as far as the drain, and
- in this hole, a drain pre-contact layer is formed.

Preferably, the gate and this drain pre-contact layer are formed at the same time.

Preferably, the source zone is formed by implanting ions in the substrate that are able to lead to predefined doping of this substrate, or by epitaxy on this substrate of a semiconductor having this predefined doping.

Also preferably, the drain is formed by epitaxy or by ion implantation.

BRIEF DESCRIPTION OF THE DRAWINGS

The present invention will be better understood on reading the description of examples of embodiment given below purely for illustrative purposes and which are in no way limitative, with reference to the appended drawings in which.

DETAILED DESCRIPTION OF PARTICULAR EMBODIMENTS

Figure 1:
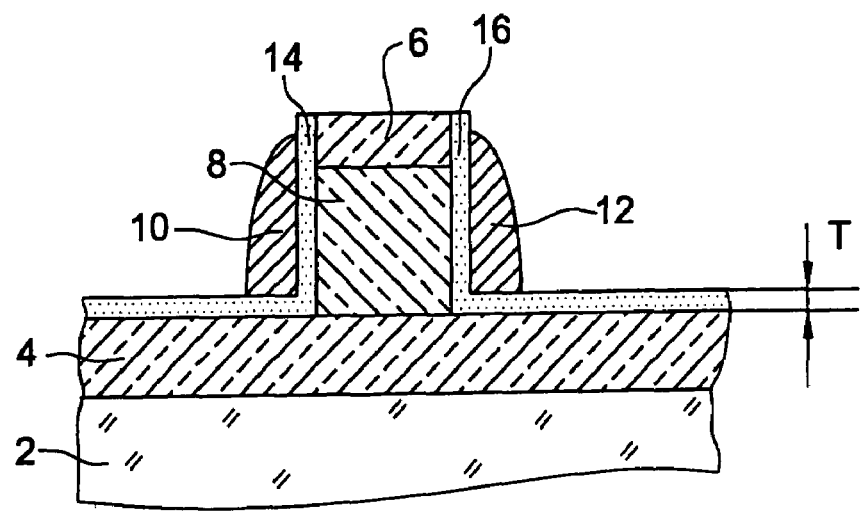
FIG. 1 is schematic cross section view of a known vertical MOS transistor and already described, FIGS. 2 to 9 schematically illustrate steps of a particular embodiment for implementing the process that is the subject of the invention.

FIGS. 2 to 9 schematically illustrate the steps of an example of the process that is the subject of the invention, with which it is possible to obtain a vertical MOS transistor with embedded metal gate according to the invention.

It is to be noted that one problem solved by the present invention is the reduction of stray capacitance, in a vertical MOS transistor, between the gate and the source and between the gate and the drain of the transistor, while nevertheless having an electrical insulator of narrow thickness between the gate and the channel of the transistor.

To solve this problem, it is proposed in this invention to minimize the cover zones between firstly the gate and the drain and secondly between the source and the gate. For this purpose, the drain is moved as far away as possible but with continued covering of the gate. Also, to insulate the gate both from the source and from the drain, the invention uses a stack of two insulators, namely a thick insulator (formed by the two thick insulating layers 66 and 67 in the example under consideration) and a thin insulator (formed by the thin insulating layers 70 and 72 in the example under consideration). The thin insulator is positioned at least between the gate and the channel because transistor performance is dependent upon the capacitance between the gate and the channel; the thinner the gate insulator, the higher the current produced by the transistor. The thick insulator is located underneath and insulates the gate from the source.

In addition, the architecture of the transistor that is the subject of the invention makes it possible to reduce stray capacitance firstly on the edge of the gate, on the cover zone between source/gate and drain/gate, which is very difficult to achieve in a vertical transistor, and secondly at the contact point on the drain.

To implement the process illustrated in these FIGS. 2 to 9, a monocrystalline semiconductor substrate 18 is used which, in the example shown, is in p-type monocrystalline silicon.

On substrate 18, by epitaxy, a layer 20 of silicon of $n^+$ type is deposited (and therefore highly doped for example using phosphorus, arsenic or antimony) which is intended to form the source of the transistor.

Instead of using epitaxy to form this source, it is possible to implant appropriate ions (phosphorus, arsenic or antimony ions for example) in substrate 18.

Then, on layer 20, a layer 22 is deposited by epitaxy of p-type silicon (or p-type $SiGe_xC_y$) intended to form the channel of the transistor.

The drain 26 of the transistor is made by epitaxy deposit, on layer 22, of a layer 24 of n-type silicon or by n-type implanting of layer 22 to obtain layer 24 of the transistor above a zone 23 of layer 22 corresponding to the channel of this transistor. Below this zone 23, zone 27 of layer 20 corresponds to the source of the transistor.

Subsequently, above drain 26, an electrically insulating assembly 28 is formed as explained below.

Firstly, a first layer 30 in silica is deposited above drain 26 and layer 22, then a second layer 32 in silicon nitride on this layer 30.

Layers 30 and 32 are then etched to form, above drain 26, two electrically insulating zones, one 34 in silica and the other 36 in silicon nitride. The stacking of these zones 34 and 36 forms what is called the "chimney" of the transistor.

Subsequently, electrically insulating zones are formed, called "spacers". For this purpose, on the structure resulting from the previous steps and therefore on the chimney and layer 22, a layer 38 of silica or silicon nitride is deposited, and said layer 38 is etched until two electrically insulating zones 42 and 44 are obtained, forming the spacers, located either side of the chimney (and therefore either side of drain 26) above which the top end of zone 36 in silicon nitride emerges.

In this way the formation of the electrically insulating assembly 28 is completed.

Figure 2:
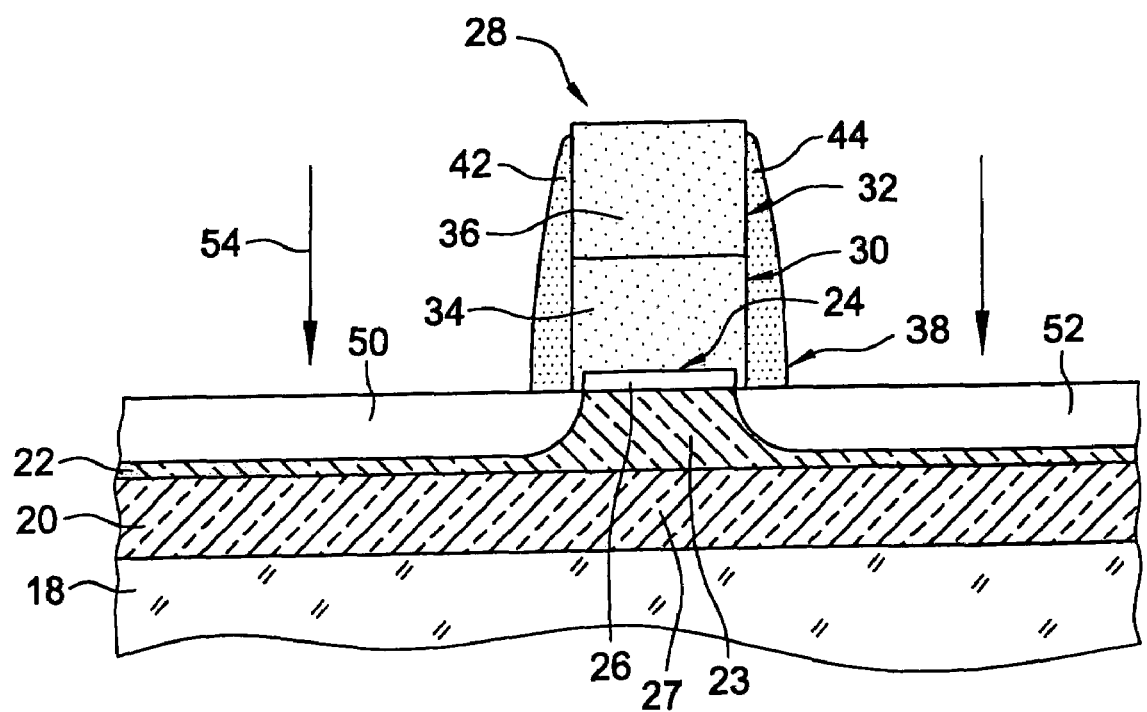

It is specified that the structure seen in FIG. 2 also comprises two field insulation zones (not shown) positioned either side of this assembly 28, which are fabricated before the assembly, using the so-called LOCOS method for example. These field insulation zones are intended to electrically insulate the transistor to be formed from other identical transistors (not shown) also formed from substrate 18 and layers 20, 22 and 24.

In layer 22, two recesses 46 and 48 are then formed (FIG. 3) between these field insulation zones and the channel zone 23. These recesses 46 and 48 extend underneath the spacers 42 and 44 and may, if desired, extend underneath drain 26 of the transistor.

To obtain these recesses 46 and 48, layer 22 may be etched in isotropic and selective fashion relative to the field insulation and the spacers, for an appropriate period of time.

Figure 3:
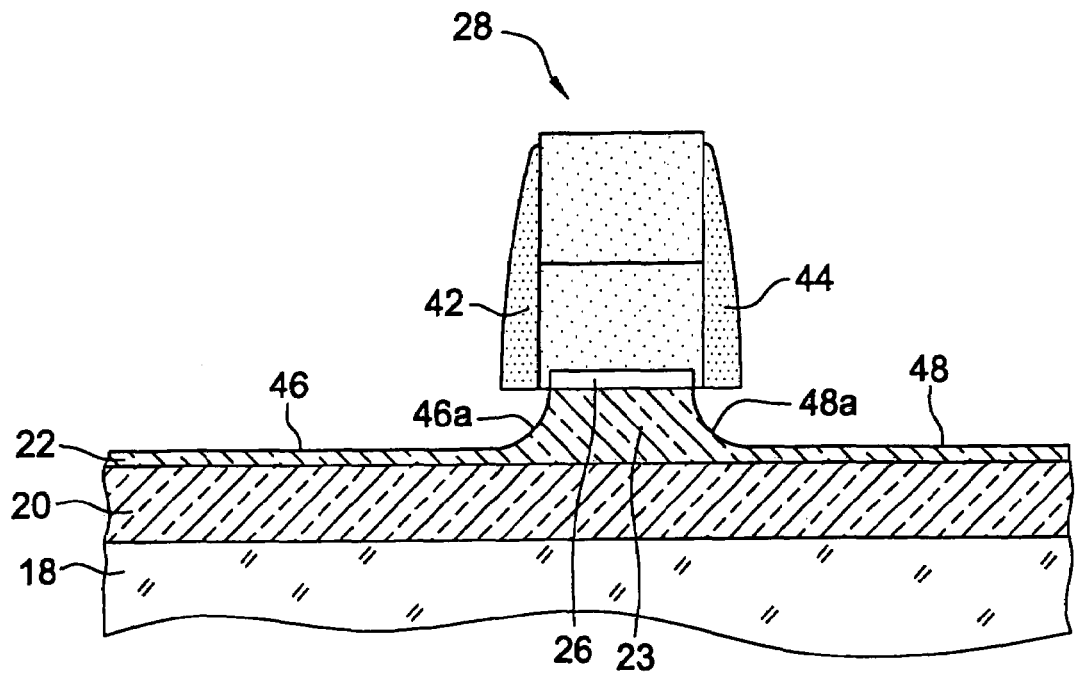
Figure 4:
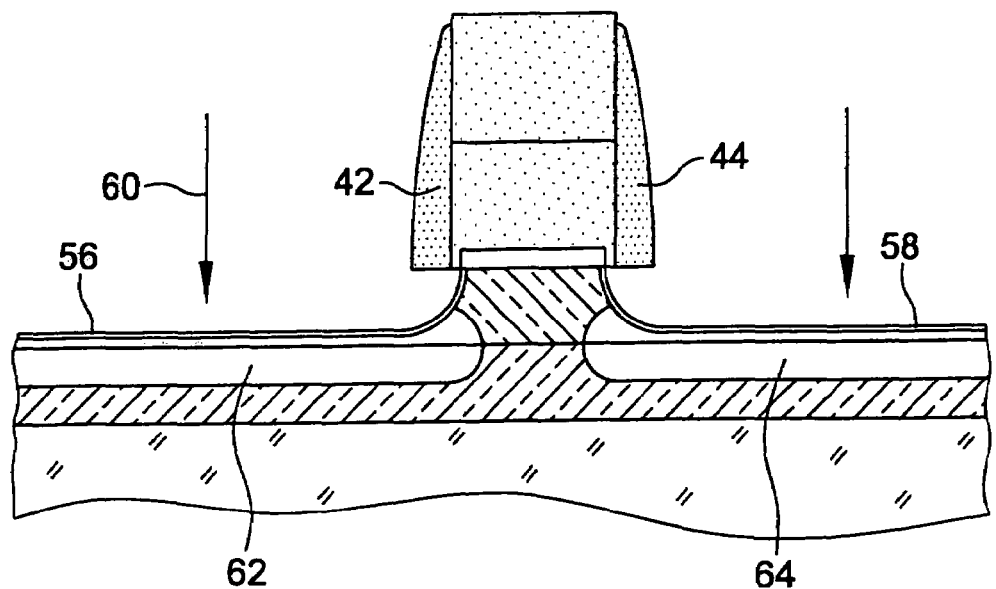
Figure 5:
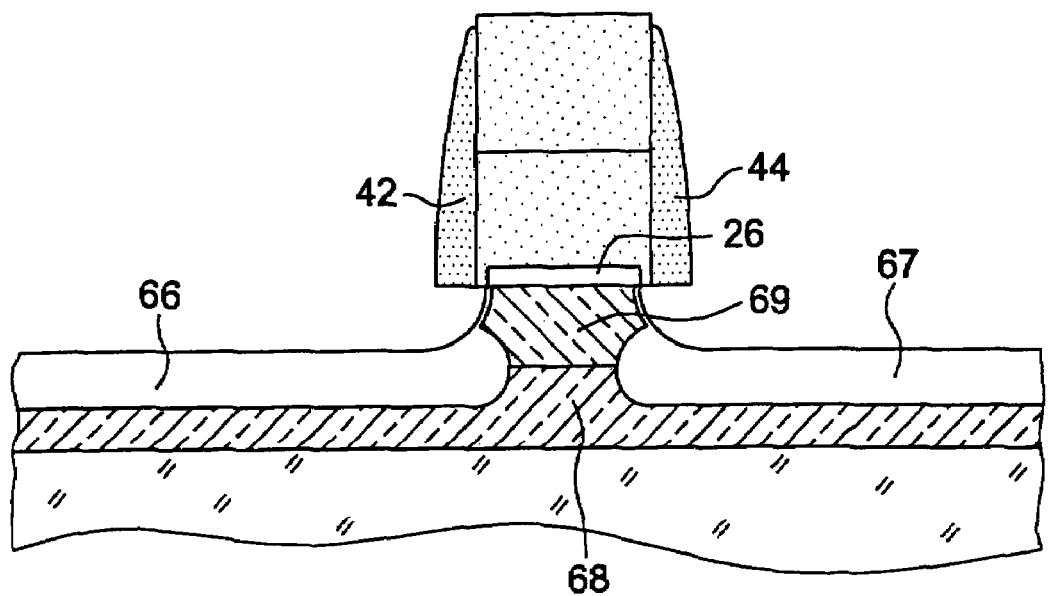

However, for improved geometrical control over the end structure that can be seen in FIG. 3, it is preferable, to obtain these recesses 46 and 48, to conduct high dose $p^+$-type implantation, for example using boron nuclei, in zones 50 and 52 (see FIG. 2) of layer 22, these zones 50 and 52 corresponding to the recesses 46 and 48 to be obtained. FIG. 2 also shows the beam 54 of $B^+$ ions used.

Implantation annealing, followed by diffusion, makes it possible to adjust the width of the transistor channel to be produced.

Selective etching of $p^+$ silicon is then made in zones 50 and 52 relative to the p-type silicon of layer 22 (where no implantation was made).

A mixture which can be used for this purpose is mentioned in the international application cited above.

The zones exposed after the above-mentioned selective etching are then nitrided using ammonia gas for example, which leads to obtaining very thin layers 56 and 58 (FIG. 4) in silicon nitride on sidewalls 46a and 48a of recesses 46 and 48, which sidewalls are located underneath the assembly 28, and at the bottom of these recesses.

High dose $n^+$ type implantation is then conducted, for example using a beam 60 of $As^+$ or $P^+$ ions, in layer 22, at the bottom of recesses 46 and 48 and through layers 56 and 58. The zones resulting from this implantation are denoted 62 and 64 in FIG. 4.

After activation of the dopants, the implanted zones 62 and 64 are oxidized. The oxidized zones are denoted 66 and 67 in FIG. 5. Source 68 of the transistor is shown in this FIG. 5 which is located underneath channel 69 of this transistor, this channel itself being located under the drain 26 of the transistor.

Figure 6:
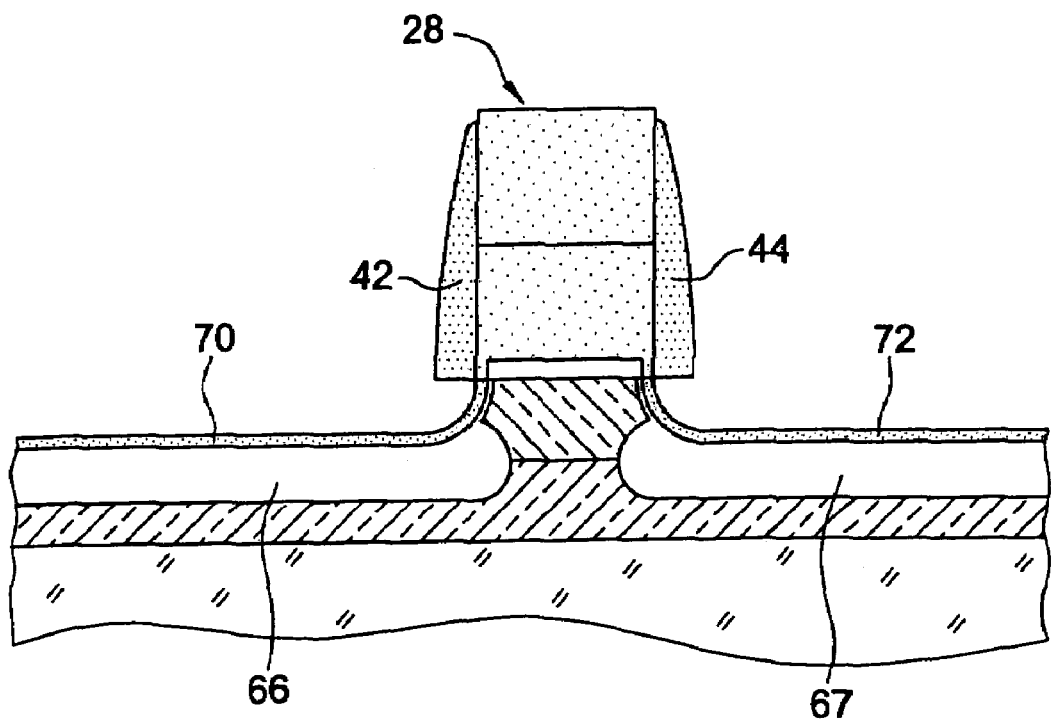

A gate insulator is then deposited. For this purpose, thin layers 70 and 72 are deposited, in silica for example (FIG. 6) on zones 66 and 67 respectively which form thick insulating layers, zones 70 and 72 extending as far as the lower part of the electrically insulating assembly 28 as seen in FIG. 6.

A hole 74 is then formed (FIG. 7), reaching as far as drain 26, by lithography and etching of zones 36 and 34 of the electrically insulating assembly 28, then inside this hole 74 selective epitaxy is used to grow a drain pre-contact layer 76 in silicon or $SiGe_xC_y$, or in a metal chosen for example from among cobalt, tungsten and titanium. The thickness of this layer is adjustable.

It is to be noted that if the metal is epitaxied, a silicide may form on the interface between this metal and the drain 26.

The transistor gate is then formed either side of the electrically insulating assembly 28 (FIG. 7) while completing the drain pre-contact.

It is pointed out that the gate is not necessarily metallic. It may be made in $n^+$ doped (respectively $p^+$) polycrystalline silicon for a transistor with n (respectively p) channel, deposited using the LPCVD method for example.

As a general rule, it may be made in a doped semiconductor material, silicon or germanium for example.

Figure 7:
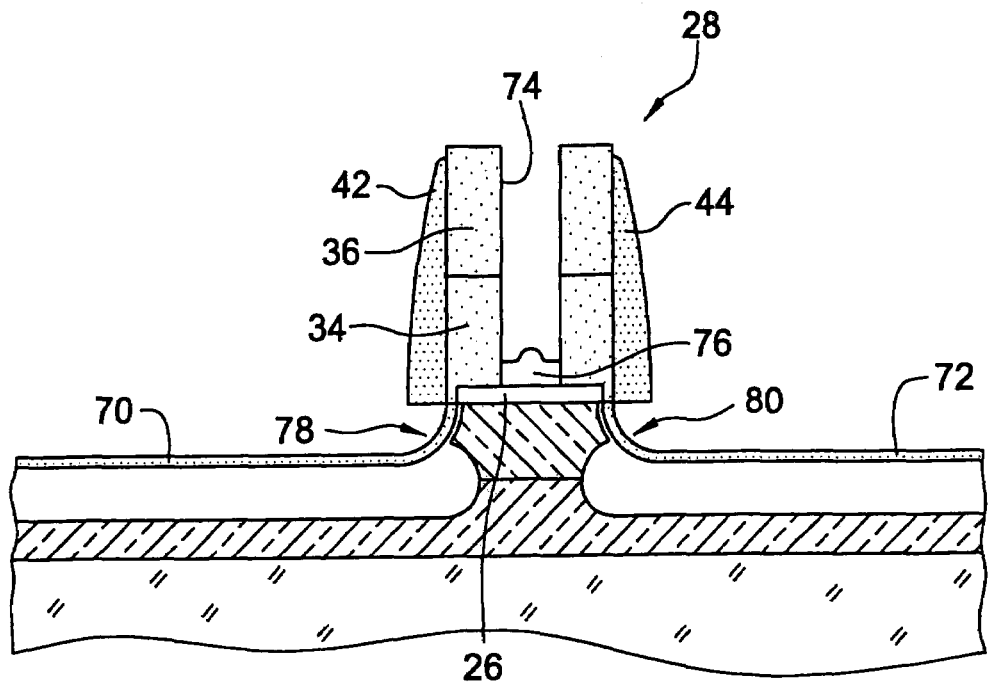

According to one advantageous embodiment, to form the gate (while completing the drain pre-contact) a metal is deposited chosen for example from among cobalt, tungsten and titanium, on the structure obtained in FIG. 7, using chemical vapour deposition for example. The deposited metal projects beyond the upper level of zone 36 in silicon nitride.

Figure 8:
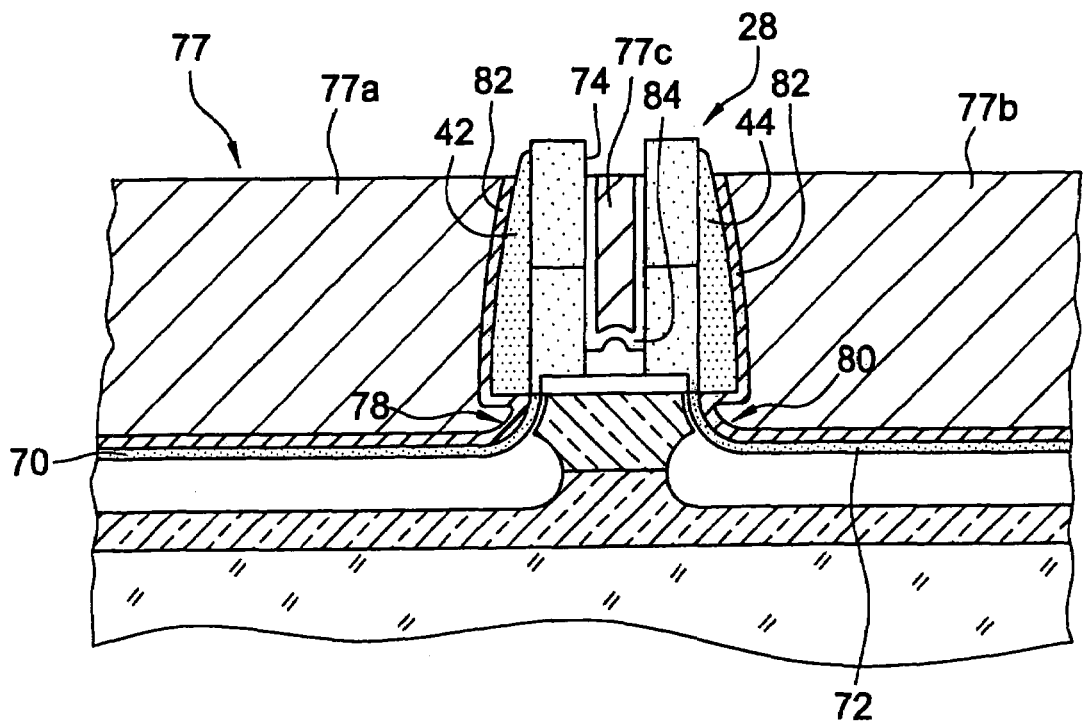

This metal is then planarized: it is polished, zone 36 acting as stop layer for the polishing process. FIG. 8 shows the planarized metal layer 77 obtained, which extends into hole 74 either side of assembly 28.

Zone 34 not only acts as electrical insulation layer but also as a buffer layer.

Defects would arise if silicon nitride were to be formed directly on drain 26, obtained by epitaxy and etching, then embedded silica through heat oxidation.

Before depositing the metal used to form layer 77, it is possible (but not indispensable) to fill cavities 78 and 80 (FIG. 7) with metal, which exist underneath spacers 42 and 44 subsequent to the preceding steps in the process. For this purpose chemical vapour deposition of cobalt, tungsten or titanium for example is used.

In FIG. 8 the metal layers 82 resulting from this depositing can be seen. This metal fills cavities 78 and 80 while covering the sides of spacers 42 and 44 and the surface of layers 70 and 72.

Instead of forming these layers 82, it is possible with a layer 84 of the metal under consideration to cover both the sides of hole 74 and layer 76 formed in the latter, or even to form layers 82 and 84 at the same time.

The contacts of the transistor are then formed.

For this purpose, the whole of the structure in FIG. 8 is covered with an electrically insulating layer 86 (FIG. 9) in silica glass doped with phosphorus or boron. Three openings are then formed which pass right through this layer 86 leading respectively to the two zones 77a and 77b of metal layer 77 corresponding to the gate of the transistor, and to zone 77c of this layer 77 corresponding to the transistor drain pre-contact.

These three openings are filled with a metal, by chemical vapour deposition to form two gate contacts 88 and 90 and a drain contact 92.

On the surface of layer 86, three metal interconnection layers are formed 94, 96 and 98 which respectively extend contacts 88, 90 and 92.

The source contact of the transistor is not shown. To obtain this contact, it is possible to form a metallic layer on the under surface of substrate 18.

In this manner the formation of the vertical MOS transistor with embedded metallic gate according to the invention is completed.

In the described example, p-type silicon was used for the substrate, but the invention evidently encompasses the transistors and corresponding fabrication processes which use a substrate in n-type silicon. In this case, a source in $p^+$-type silicon is formed with a channel in n-type silicon or n-type $SiGe_xC_y$ and a drain in p-type silicon. Evidently, it is possible to use any other appropriate semiconductor (of n-type or p-type) to form the transistor.

When applying the invention, it is specified that it may be advantageous to use a first gate metal to obtain a n-channel transistor, and a second gate metal, different to the first metal, to obtain a p-channel transistor, so as to obtain opposing threshold voltages.

Figure 9:
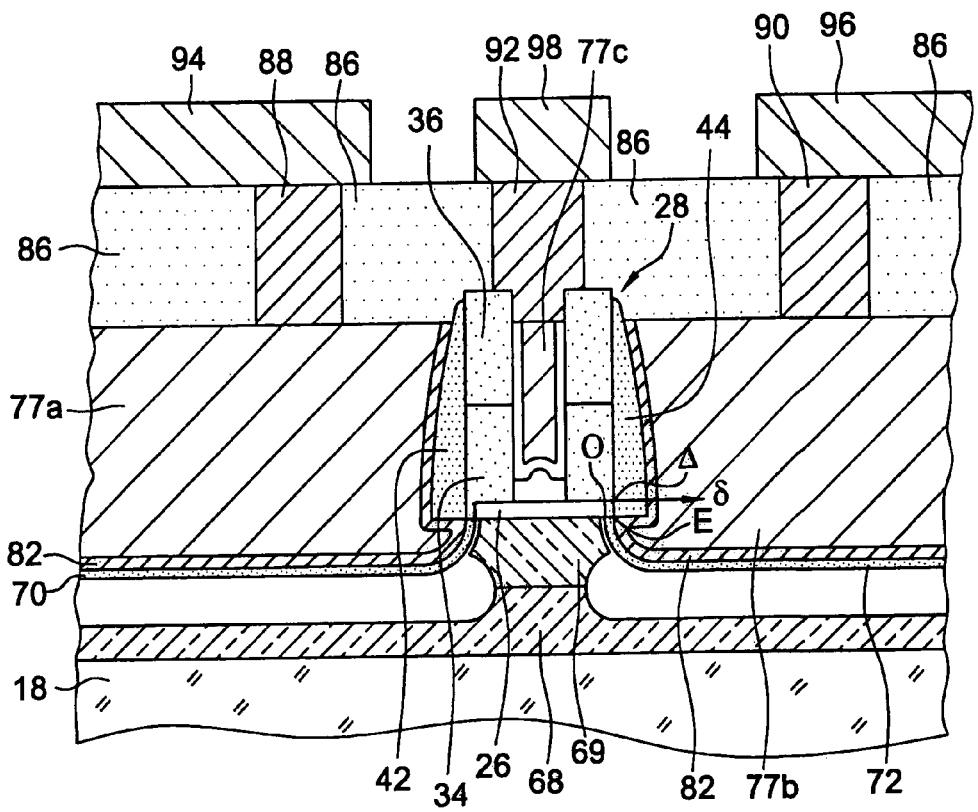

Further reference will now be made to FIG. 9 to demonstrate the possibilities provided by the invention, in which the transistor is to be observed along the plane of its cross section, and an axis 8 of this plane is considered, this axis being substantially parallel to the surface of substrate 18 and oriented towards the right of FIG. 9. Since the gate is protected by spacers 42 and 44, the distance Δ between the projection of the right end E of the gate on this axis and the right end 0 of the drain (origin of axis δ), a distance which is positive in the example in FIG. 9, could be nil or even negative if recesses 46 and 48 (FIG. 3) are formed such that they are sufficiently sunk beneath insulating assembly 28.

Figure 10:
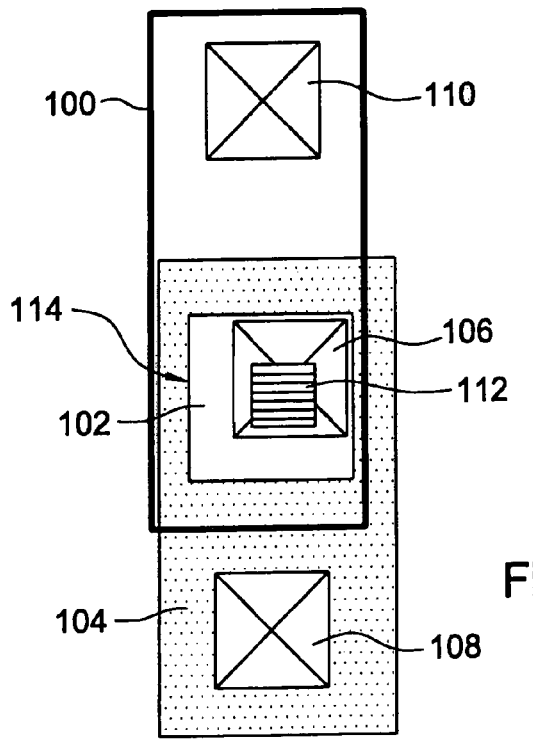
FIG. 10 is a schematic partial overhead view of a transistor of the invention.

FIG. 10 is a schematic partial overhead view of an implantation layout for an example of a vertical MOS transistor with metal gate according to the invention.

In FIG. 10, source 100 can be seen and drain 102 and gate 104 of the transistor. References 106, 108 and 110 respectively represent the drain contact, a gate contact and a source contact. Reference 112 represents the drain pre-contact and reference 114 denotes a silicon pillar which corresponds to the assembly denoted 28 (including 42 and 44) in FIG. 9.

The substrate on which this transistor is formed is not shown.

In relation to the size of a conventional horizontal MOS transistor, the occupied surface area is reduced by a factor of at least 2. For a given drain size, the width of the transistor is four times greater in a conventional transistor since the gate 104 "surrounds" the silicon pillar 114 on the four sides. The clearance from gate edge to drain (that is to say the space separating the edge of gate 104 (see FIG. 10) from the edge of assembly 28 (see FIG. 9) is at the most equivalent to the alignment tolerance provided by level to level lithography, that is to say the lithography used to align the level of the gate in relation to the level of the drain.

Figure 11A:
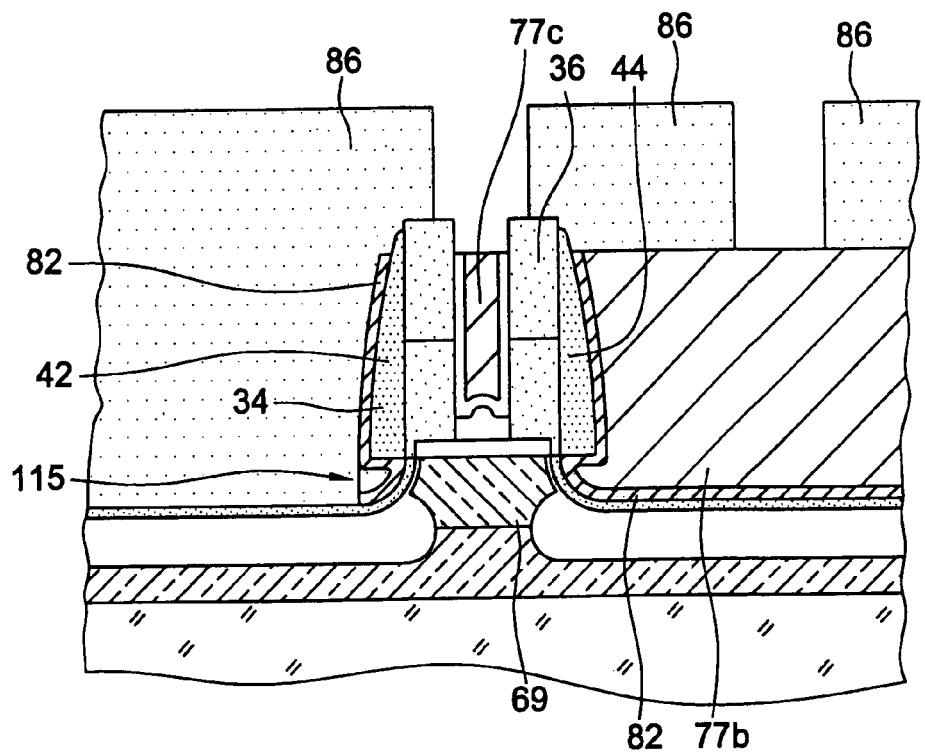
FIG. 11A is a schematic cross section view of a transistor of the invention in which the clearance between the gate and the drain is nil.

FIG. 11A is a partial cross section diagram of a transistor of the invention. It illustrates the case in which the "depositioning" of the gate relative to the drain is nil.

With the invention it is possible to allow for zero clearance between the gate and the drain since a metal residue will still remain under the spacer making it possible to make a gate coating the drain.

This makes it possible to produce a transistor of smaller size than those of the prior art; the gain in gate compactness is substantially equivalent to the thickness of the gate.

Figure 11B:
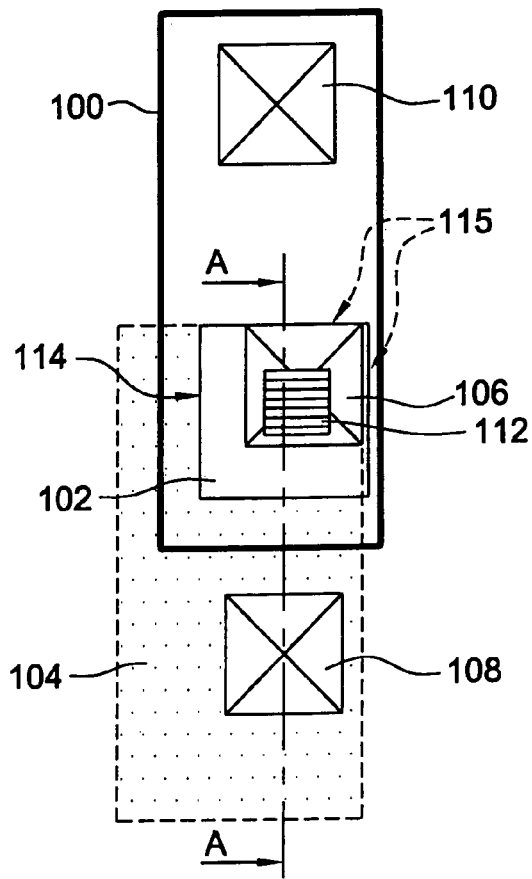
FIG. 11B is a schematic partial overhead view of this transistor.

FIG. 11B is a partial schematic overhead view of the transistor in FIG. 11A. FIG. 11A corresponds to section AA in FIG. 11B.

In these FIGS. 11A and 11B, reference 115 denotes the residues of planarization and contact metal plus the gate metal.

In FIG. 11A the planarization and contact metal corresponds to reference 77b. Layers 82 correspond to the gate metal. Insulating layer 86 can also be seen.

FIG. 11B also shows source 100, drain 102, gate 104, drain contact 106, gate contact 108, source contact 110, drain pre-contact 112 and silicon pillar 114.

With the present invention it is possible to apply CMOS technology with dual metal gates, this technology using metal with $n^+$-type extraction potential for n-channel MOS transistors, and a metal with $p^+$-type extraction potential for p-channel MOS transistors.

Figure 12:
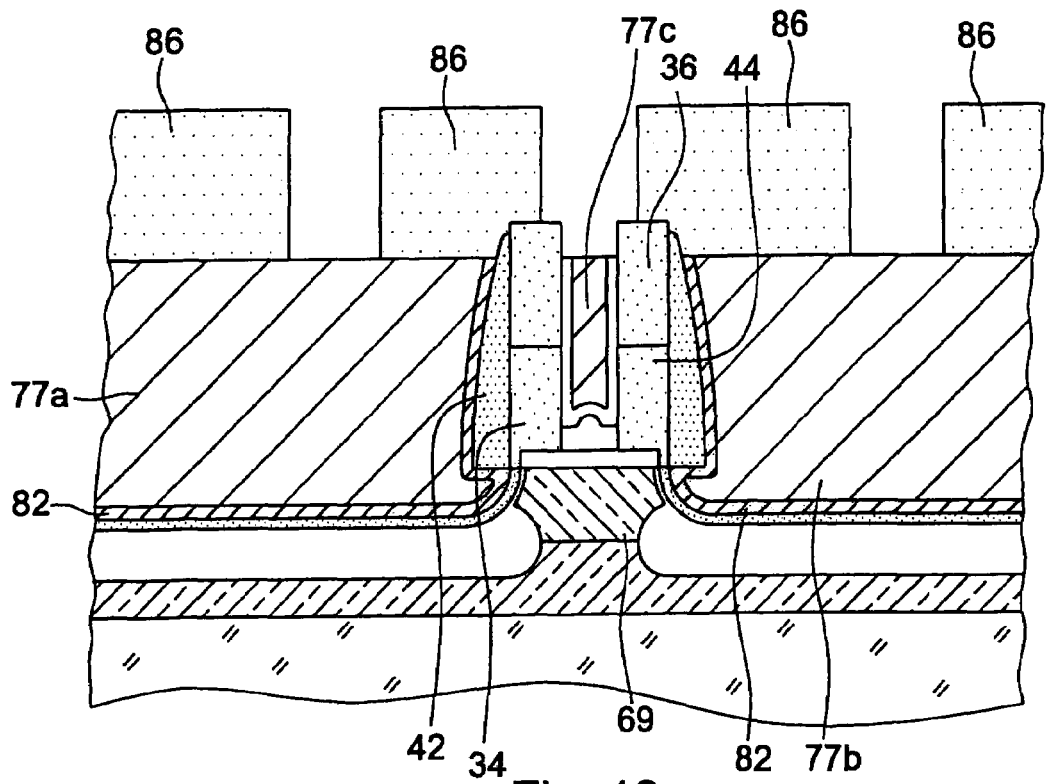
FIGS. 12 and 13 are schematic cross section views of MOS transistors according to the invention which complement one another.

For this purpose, after the epitaxy step on the bottom surface of hole 74 (FIG. 7), a layer of silicon nitride is deposited which protects the HiK of etching with masking of gate material or (and) of planarized gate on the side it is sacrificial. After polishing the metal layers of the transistor, they are removed by wet process on the non-desired side and selectively in relation to the silicon nitride. After forming insulating layer 86, a vertical MOS transistor is obtained of X type according to the invention which is schematically illustrated in FIG. 12.

Figure 13:
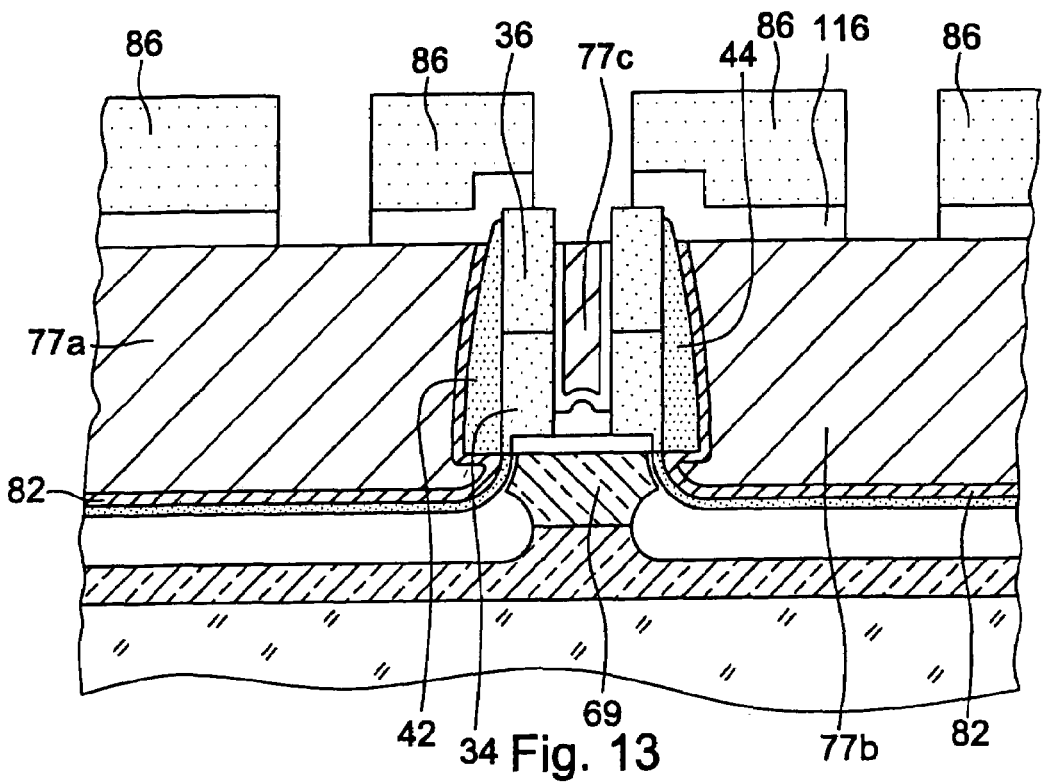

To obtain the X̄ type vertical MOS transistor according to the invention seen in FIG. 13, the gate metal 77a, 77b and 77c is protected on the side where it is desired by a layer of silicon nitride 116.

The layer of silicon nitride denoted 116 therefore acts as polishing stop layer for the second metal, that is the metal denoted 77a, 77b and 77c.

The invention claimed is:

1. A fabrication process for a vertical MOS transistor comprising:
    forming a source in or on a semiconductor substrate;
    forming a channel above the source, the channel made of a semiconductor material;
    forming a drain above the channel;
    forming, above the drain, an electrically insulating assembly including electrically insulating zones on either side of the drain;
    forming, in the semiconductor material, two recesses on either side of the electrically insulating assembly, respective sidewalls of the two recesses closest to the electrically insulating assembly being positioned beneath the electrically insulating assembly and on either side of the channel to form cavities;
    forming first electrically insulating layers beneath the two recesses;
    forming second electrically insulating layers on said first electrically insulating layers and on the sidewalls of the two recesses;
    forming a gate, on either side of the electrically insulating assembly, reaching into the cavities;
    forming a hole extending as far as the drain through the electrically insulating assembly; and
    forming a drain pre-contact in the hole.

2. A fabrication process according to claim 1, wherein said step of forming said second electrically insulating layers is performed such that said second electrically insulating layers extend as far as a lower part of said electrically insulated assembly.

3. A fabrication process according to claim 1, wherein said step of forming said recess is performed such that said recesses extend underneath said drain.

4. A fabrication process according to claim 1, wherein the gate is formed at a same time as the drain pre-contact.

5. A fabrication process according to claim 1, wherein said steps of forming said first and second electrically insulating layers are performed such that said first electrically insulating layers are thicker than said second electrically insulating layers.

6. A fabrication process according to claim 5, wherein said step of forming said second electrically insulating layers is performed such that said second electrically insulating layers are positioned between the gate and the channel.

7. A fabrication process according to claim 6, wherein said step of forming said first electrically insulating layers is performed such that said first electrically insulating layers are positioned to insulate the gate from the source.

8. A fabrication process according to claim 1, wherein said gate is made of metallic material.

9. A fabrication process according to claim 1, wherein said source, said channel and said drain are made in silicon.

10. A fabrication process according to claim 1, wherein said step of forming said electrically insulating assembly includes forming a first layer on the drain and a second layer on the first layer, said first and second layers of said electrically insulating assembly being positioned between said insulating zones, and wherein said hole is formed through said first and second layers of said electrically insulating assembly.

* * * * *